(12) United States Patent
Straw et al.

(10) Patent No.: US 11,749,498 B2
(45) Date of Patent: *Sep. 5, 2023

(54) SYSTEM AND METHOD FOR PREPARATION AND DELIVERY OF BIOLOGICAL SAMPLES FOR CHARGED PARTICLE ANALYSIS

(71) Applicant: FEI Company, Hillsboro, OR (US)

(72) Inventors: Marcus Straw, Hillsboro, OR (US); Alexander Makarov, Bremen (DE); Josh Gilbert, Hillsboro, OR (US); Aaron Torok, Hillsboro, OR (US); Joseph Christian, Hillsboro, OR (US); Alan Bahm, Hillsboro, OR (US); Kun Liu, Hillsboro, OR (US); Tom Nichols, Hillsboro, OR (US); Jeff Kosmoski, Hillsboro, OR (US); Dmitry Grinfeld, Hillsboro, OR (US)

(73) Assignee: FEI Company, Hillsboro, OR (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/559,553

(22) Filed: Dec. 22, 2021

(65) Prior Publication Data

US 2022/0115205 A1  Apr. 14, 2022

Related U.S. Application Data

(63) Continuation of application No. 16/914,924, filed on Jun. 29, 2020, now Pat. No. 11,217,425.

(51) Int. Cl.
*H01J 37/295* (2006.01)
*H01J 37/20* (2006.01)
*H01J 49/42* (2006.01)

(52) U.S. Cl.
CPC ............ *H01J 37/295* (2013.01); *H01J 37/20* (2013.01); *H01J 49/4215* (2013.01)

(58) Field of Classification Search
CPC ...... H01J 37/295; H01J 37/20; H01J 49/4215; H01J 37/26; H01J 2237/05;
(Continued)

(56) References Cited

U.S. PATENT DOCUMENTS 7,195,751 B2 * 3/2007 Pappin ................. G01N 33/532
546/208
8,309,359 B2 * 11/2012 Sohn ...................... G01N 33/58
436/174
(Continued)

FOREIGN PATENT DOCUMENTS

WO  WO-2017118494 A1  7/2017

OTHER PUBLICATIONS

EP20182790.4, Extended European Search Report, dated Oct. 28, 2020, 8 pages.
(Continued)

*Primary Examiner* — David A Vanore

(57) ABSTRACT

Systems and method for the preparation and delivery of biological samples for charged particle analysis are disclosed herein. An example system at least includes an ion filter coupled to select a sample ion from an ionized sample supply, the ion filter including a quadrupole filter to select the sample ion from the sample supply, an energy reduction cell coupled to receive the selected sample ion and reduce a kinetic energy of the sample ion, a validation unit coupled to receive the sample ion and determine whether the sample ion is a target sample ion, a substrate coupled to receive the sample, wherein the substrate is electron transparent, an ion transport module coupled to receive the sample ion from the ion filter and transport the sample ion to the substrate, and (Continued)

an imaging system arranged to image, with a low energy charged particle beam, the sample located on the substrate, wherein the substrate is arranged in an analysis location. The imaging system including a charge particle emitter coupled to direct coherent charged particles toward the sample; and a detector arranged to detect interference patterns formed from interaction of the coherent charged particles and the sample.

26 Claims, 6 Drawing Sheets

(58) Field of Classification Search
CPC ..... H01J 2237/2614; G01N 1/34; G01N 1/28; G01N 27/62; G01N 35/10
See application file for complete search history.

(56) References Cited

U.S. PATENT DOCUMENTS

| | | | |
|---|---|---|---|
| 10,720,315 B2 | 7/2020 | Taghioskoui | |
| 10,840,077 B2 | 11/2020 | Taghioskoui | |
| 10,978,272 B2* | 4/2021 | Vystavel | H01J 37/28 |
| 11,217,425 B2* | 1/2022 | Straw | H01J 37/26 |
| 11,219,393 B2 | 1/2022 | Taghioskoui | |
| 11,222,776 B1 | 1/2022 | Taghioskoui | |
| 11,410,829 B1* | 8/2022 | Jing | H01J 37/20 |
| 2003/0052266 A1* | 3/2003 | Shimomura | H01J 49/147 |
| | | | 250/281 |
| 2008/0250881 A1* | 10/2008 | Dona | H01J 37/20 |
| | | | 73/864.91 |
| 2014/0065319 A1* | 3/2014 | Randolph | C23C 16/0281 |
| | | | 427/551 |
| 2015/0136980 A1 | 5/2015 | Iijima | |
| 2015/0241437 A1* | 8/2015 | Zhang | G01N 33/58 |
| | | | 536/55 |
| 2018/0238792 A1* | 8/2018 | Miyamoto | G01J 3/0289 |
| 2018/0299464 A1* | 10/2018 | Li | G01N 33/6848 |
| 2019/0206664 A1* | 7/2019 | De Marco | H01J 37/32009 |
| 2020/0199071 A1* | 6/2020 | Carell | C07D 207/46 |
| 2020/0411282 A1* | 12/2020 | Straw | H01J 37/20 |

OTHER PUBLICATIONS

Germann M, et al, "Nondestructive Imaging of Individual Biomolecules", Physical Review Letters, The American Physical Society, Mar. 5, 2010, vol. 104, pp. 095501-1-095501-4.

Hwang L-S, et al, "Noble-Metal Covered W(111) Single-Atom Electron Sources", Journal of the Electrochemical Society, The Electrochemical Society, Dec. 18, 2009, vol. 157, pp. 7-12.

Latychevskaia T, et al, "Practical Algorithms for Simulation and Reconstruction of Digital In-Line Holograms", Applied Optics, Optical Society of America, Mar. 20, 2015, vol. 54, No. 9, pp. 2425-2434.

Longchamp J-N, et al, "Imaging Proteins at the Single-Molecule Level", PNAS, Feb. 14, 2017, vol. 114, No. 7, pp. 1474-1479.

Mikhailov V.A., et al., Mass-Selective Soft-Landing of Protein Assemblies with Controlled Landing Energies, Analytical Chemistry, American Chemical Society, 2014, vol. 86, pp. 8321-8328.

Mutus JY, et al, "Low Energy Electron Point Projection Microscopy of Suspended Graphene, the Ultimate "Microscope Slide"", New Journal of Physics, IOP Publishing Ltd and Deutsche Physikalsche Gesellschaft, Jun. 8, 2011, vol. 13, 12 pages.

Tripathi et al., "Cleaning graphene: comparing heat treatments in air and in vacuum", arxiv.org, Cornell University Library, 201 Olin Library Cornell University Ithaca, NY 14853, Apr. 26, 2017 (Apr. 26, 2017), XP080765632, 5 pages, DOI: 10.1002/PSSR. 201700124.

* cited by examiner

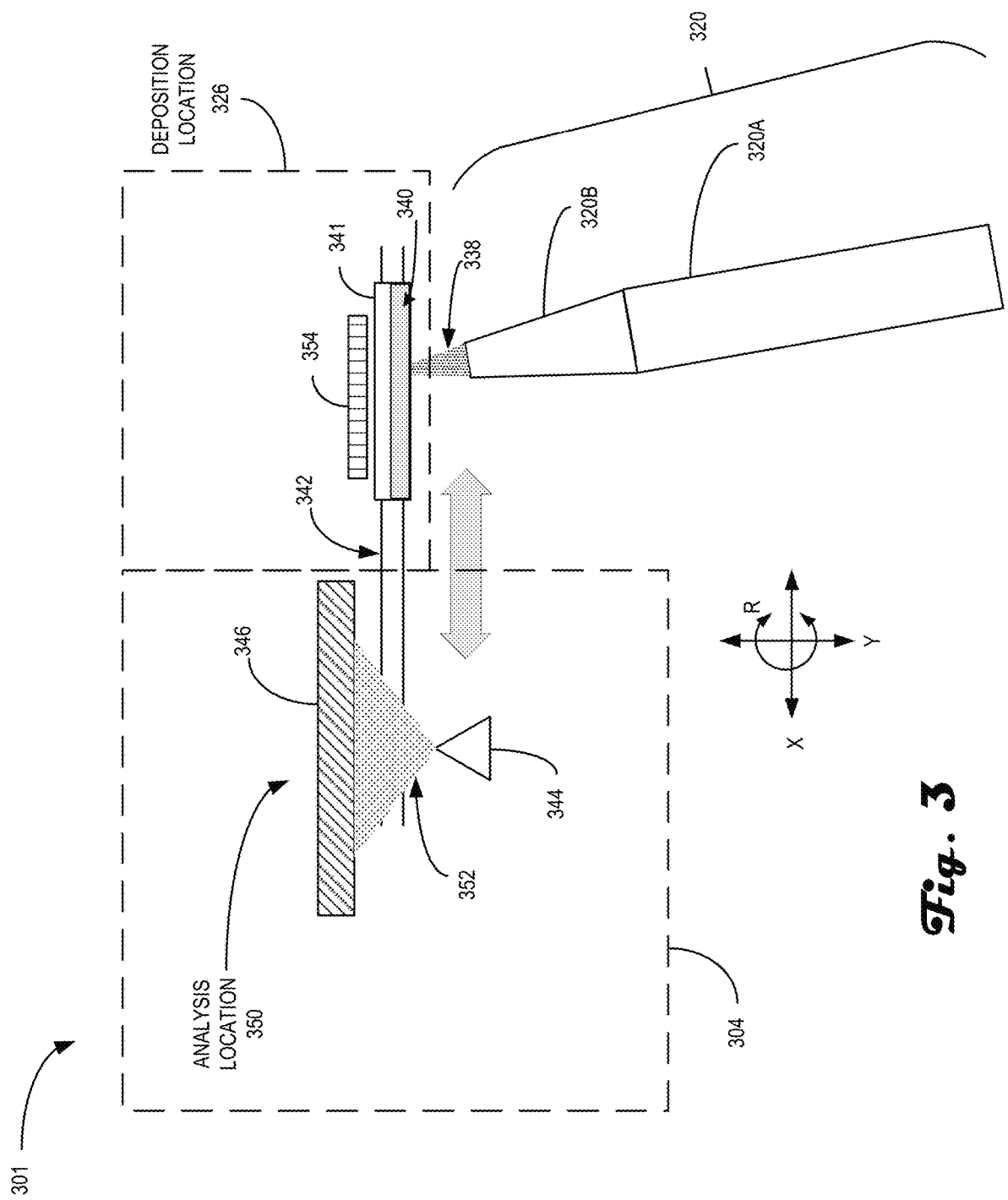

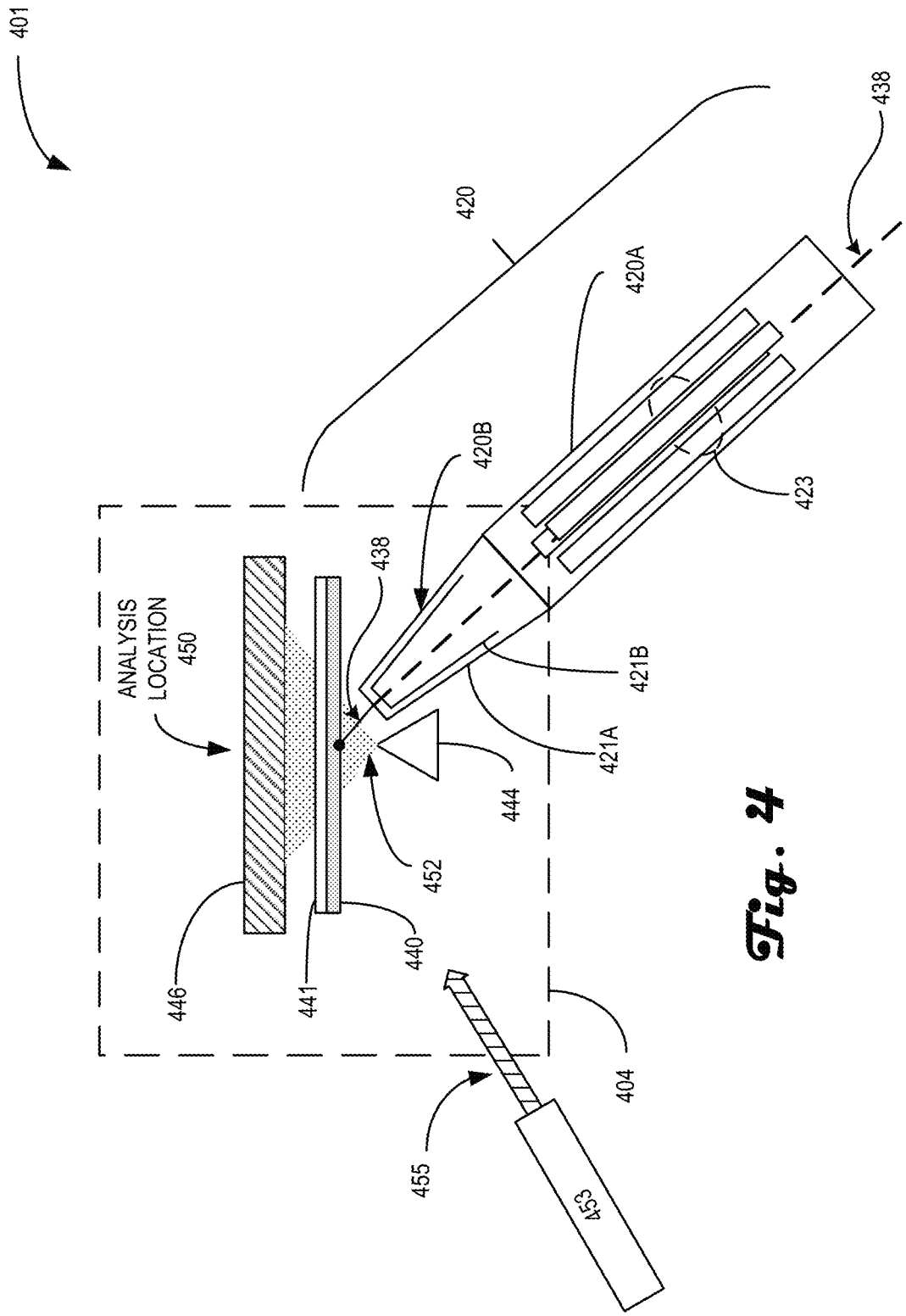

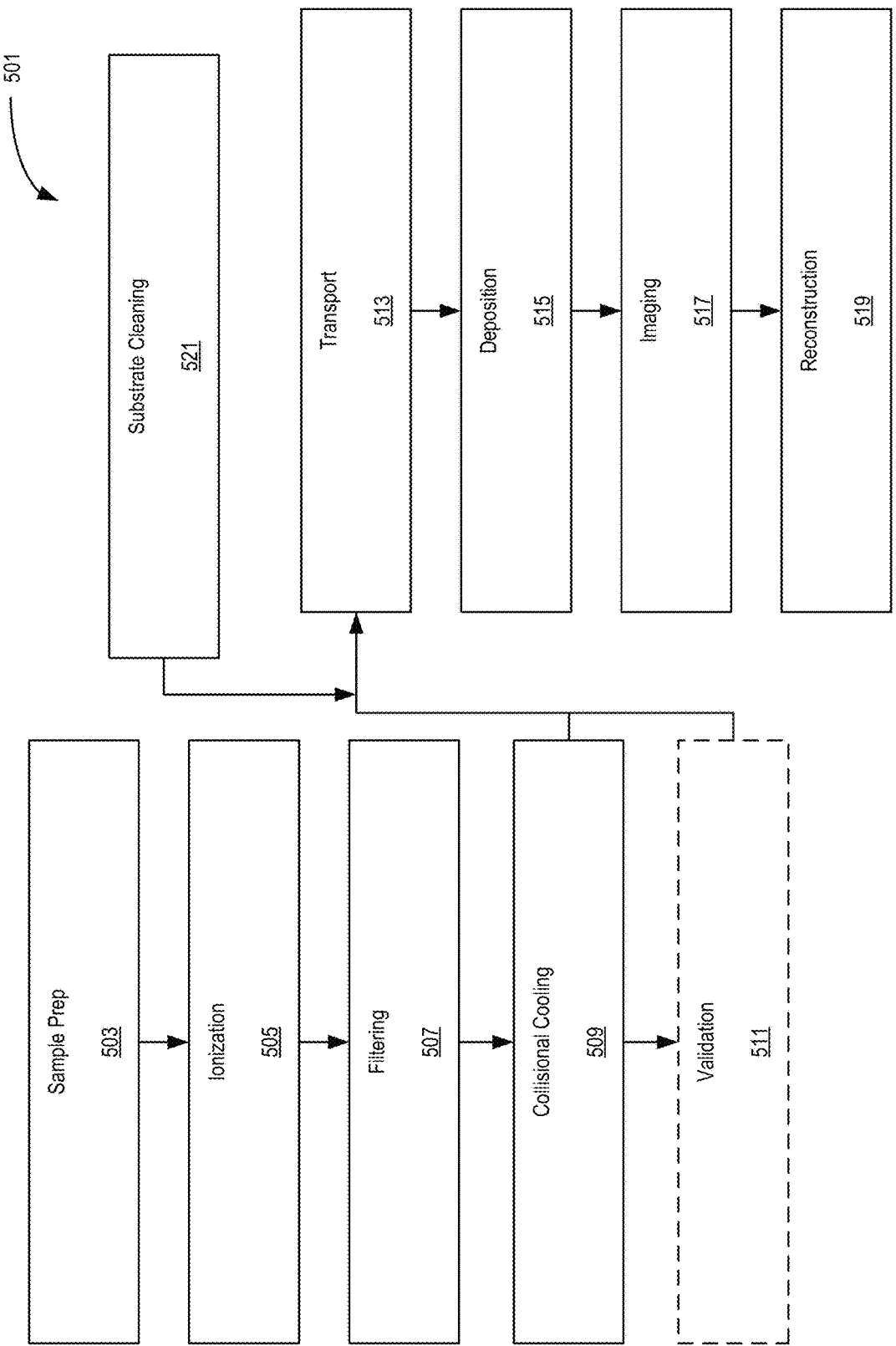

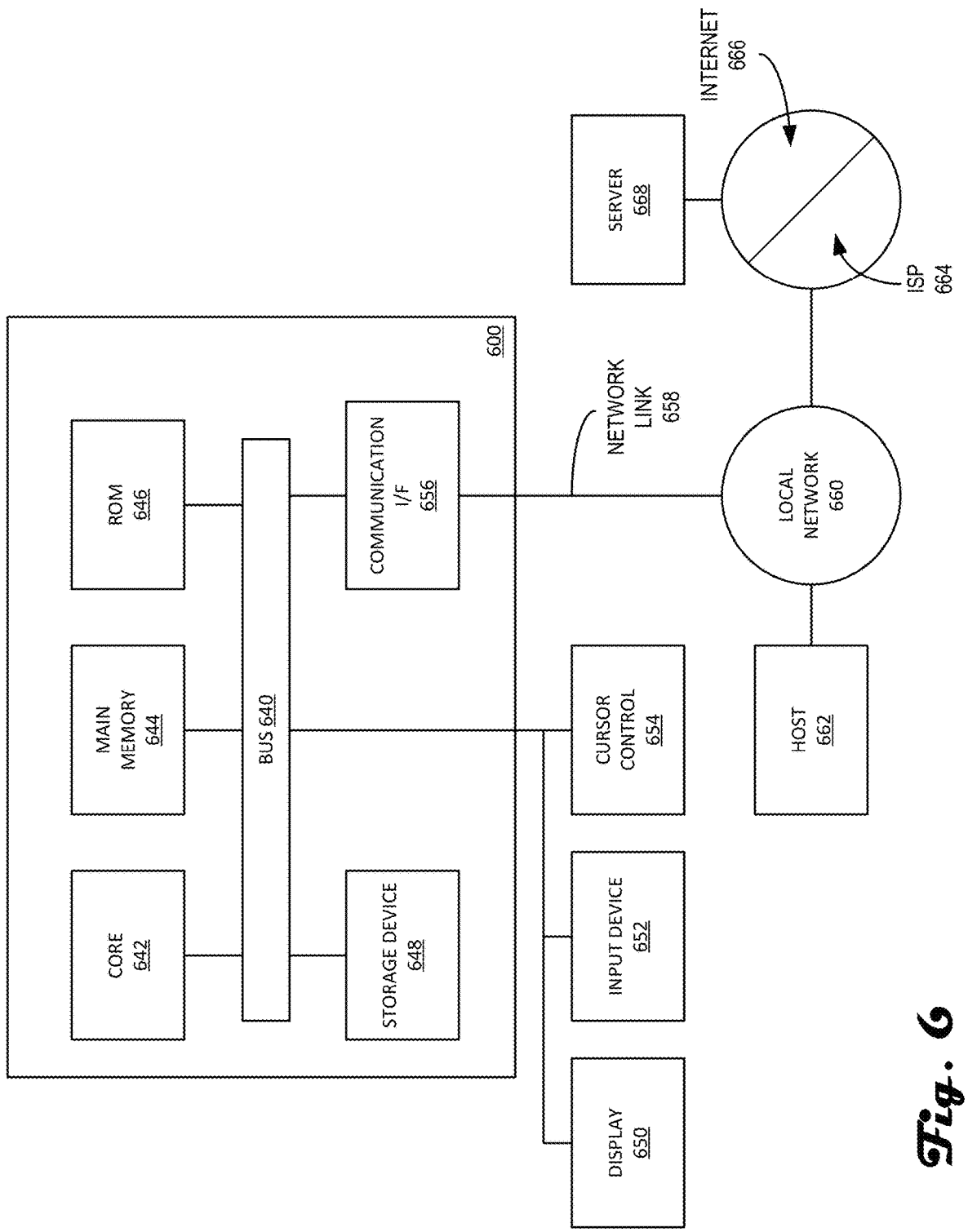

SYSTEM AND METHOD FOR PREPARATION AND DELIVERY OF BIOLOGICAL SAMPLES FOR CHARGED PARTICLE ANALYSIS

CROSS REFERENCE TO RELATED APPLICATIONS

This application claims the benefit of U.S. Provisional Application No. 62/868,648, filed Jun. 28, 2019, and is a continuation of U.S. application Ser. No. 16/914,924, filed Jun. 29, 2020, both of which are hereby incorporated by reference in their entirety.

FIELD OF THE INVENTION

This invention generally relates to biological sample preparation and analysis, and more specifically relates to structural and charge-based analysis of proteins, DNA and other macromolecular assemblies.

BACKGROUND OF THE INVENTION

Structural imaging of biological macromolecules, such as proteins, DNA or their complexes, is currently limited to samples above a certain size, 100 kDa for example, and to certain conformations, additionally, very little can be determined about their charge states. For example, proteins need to typically be crystallized for the available imaging techniques, which limits the available proteins (not all proteins crystallize). Further, the crystallization forces proteins into conformations that may not be stable, e.g., relevant, native-like, or active, in a biological context, which limits or negates the usefulness of their images. As such, the proteins available for study using current techniques are not only limited to those that can be prepared as needed but also limited to those that may be in conformations that provide useful information. While many attempts have been made to solve these issues, such solutions do not provide the flexibility in sample type and size as desired. As such, evolution of protein preparation and imaging is desired.

SUMMARY

Systems and method for the preparation and delivery of biological samples for charged particle analysis are disclosed herein. An example system at least includes an ion filter coupled to select a sample ion from an ionized sample supply, the ion filter including a quadrupole filter to select the sample ion from the sample supply, an energy reduction cell coupled to receive the selected sample ion and reduce a kinetic energy of the sample ion, a validation unit coupled to receive the sample ion and determine whether the sample ion is a target sample ion, a substrate coupled to receive the sample, wherein the substrate is electron transparent, an ion transport module coupled to receive the sample ion from the ion filter and transport the sample ion to the substrate, and an imaging system arranged to image, with a low energy charged particle beam, the sample located on the substrate, wherein the substrate is arranged in an analysis location. The imaging system including a charge particle emitter coupled to direct coherent charged particles toward the sample; and a detector arranged to detect interference patterns formed from interaction of the coherent charged particles and the sample.

An example method at least includes ionizing a sample supply, filtering, with a quadrupole mass filter, a target sample ion from the ionized sample supply, depositing the target sample ion onto a substrate, and imaging, with charged particles, a target sample on the substrate, the substrate located in an analysis location, wherein the target sample is an unionized target sample ion.

BRIEF DESCRIPTION OF THE DRAWINGS

FIG. 3 is an example illustration of a sample deposition and translation arrangement in accordance with an embodiment of the present disclosure.

FIG. 4 is an illustrative deposition arrangement in accordance with an embodiment of the present disclosure.

FIG. 5 is an example method for preparing and analyzing samples in accordance with an embodiment of the present disclosure.

FIG. 6 is an example functional block diagram in accordance with an embodiment of the present disclosure.

Like reference numerals refer to corresponding parts throughout the several views of the drawings.

DETAILED DESCRIPTION OF EMBODIMENTS

Figure 1:
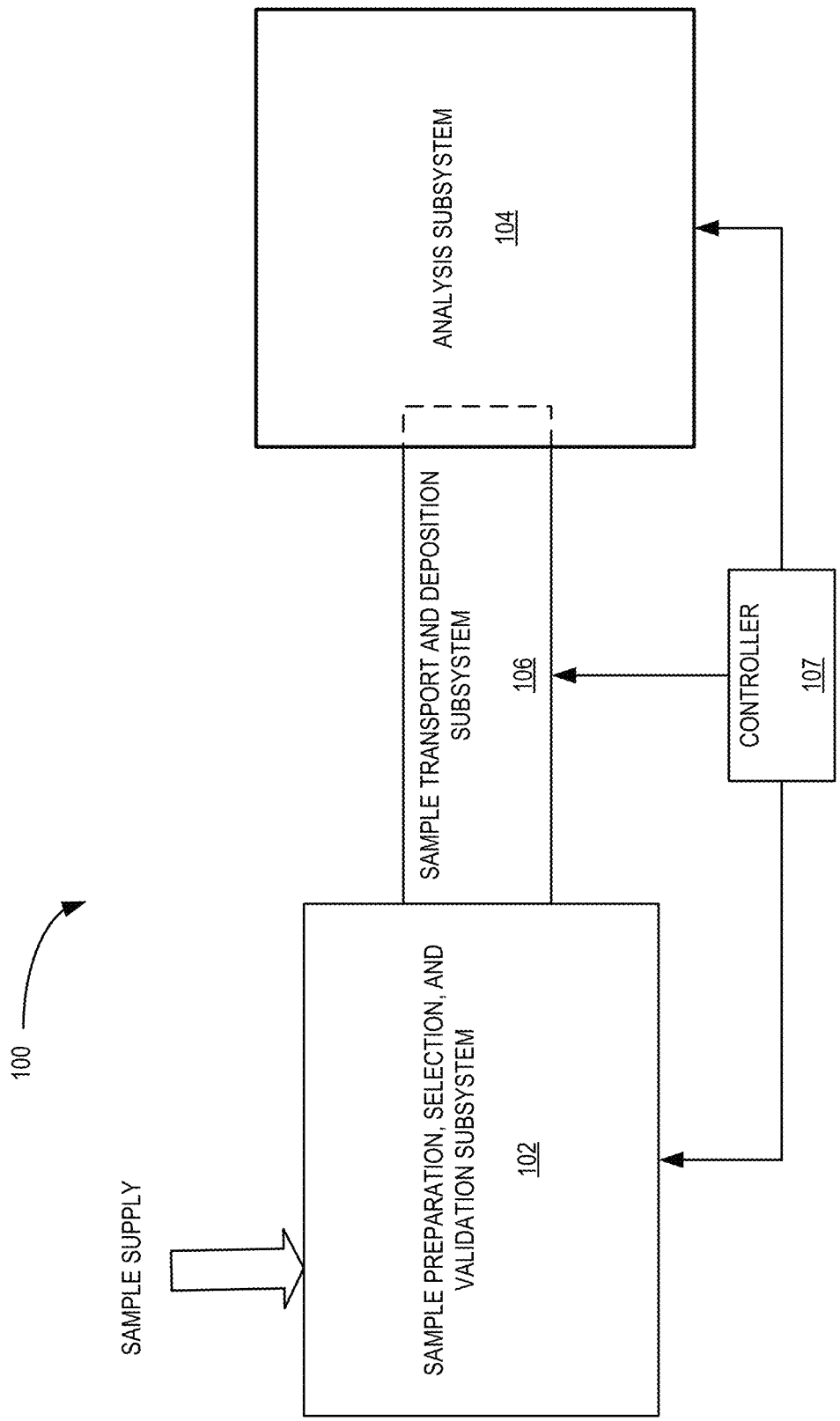
FIG. 1 is an example monolithic sample preparation and analysis system in accordance with an embodiment of the present disclosure.

Embodiments of the present invention are described below in the context of a holographic imaging system using a coherent beam of charged particles, typically at low energies, that includes sample preparation and transportation aspects. The sample preparation aspects include ionizing a desired sample and transporting the ionized sample to be deposited onto a substrate, which will hold the sample for imaging. However, it should be understood that the methods described herein are generally applicable to a wide range of holographic structural imaging methods and apparatus, and sample preparation techniques. In some examples, the disclosed techniques can be used to prepare samples for analysis using other charged particle imaging techniques, not just holographic techniques.

As used in this application and in the claims, the singular forms "a," "an," and "the" include the plural forms unless the context clearly dictates otherwise. Additionally, the term "includes" means "comprises." Further, the term "coupled" does not exclude the presence of intermediate elements between the coupled items.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed systems, methods, and apparatus can be used in conjunction with other systems, methods, and apparatus. Additionally, the description sometimes uses terms like "produce" and "provide" to describe the disclosed methods. These terms are high-level abstractions of the actual operations that are performed. The actual operations that correspond to these terms will vary depending on the particular implementation and are readily discernible by one of ordinary skill in the art.

The systems, apparatuses, and methods described herein should not be construed as limiting in any way. Instead, the present disclosure is directed toward all novel and non-obvious features and aspects of the various disclosed embodiments, alone and in various combinations and sub-combinations with one another. The disclosed systems, methods, and apparatus are not limited to any specific aspect or feature or combinations thereof, nor do the disclosed systems, methods, and apparatus require that any one or more specific advantages be present or problems be solved. Any theories of operation are to facilitate explanation, but the disclosed systems, methods, and apparatus are not limited to such theories of operation.

Within an organism, proteins facilitate biological functions by taking on various topological conformations, e.g., shapes, folds, structures, etc. Understanding this rich structure-function landscape is the ultimate goal of proteomics. Most of the currently available information on the structure of proteins comes from X-ray crystallography (XRD), cryo-electron microscopy (cryo-EM), or nuclear magnetic resonance (NMR) imaging, all of which have limitations. For XRD, proteins must first undergo crystallization. This limits this approach to only those proteins that form crystals (not all do), and proteins that are forced to crystalize by clipping off sections that are troublesome. Furthermore, crystallization can force proteins into conformations which are not stable or not relevant in a biological context. On the other hand, single particle analysis (SPA) via cryo-EM relies on data averaged over thousands of individual particles, effectively obscuring information relating to conformational differences. Finally, current contrast limitations makes it impossible to image proteins less than 50 to 100 kDa in size.

Prior solutions have been proposed for the selection and preparation of biological samples for study using various forms of imaging. For one example, electrospray has been proposed for the production of ions of protein complexes along with their transport via atmosphere-to-vacuum interface and ion optics for soft deposition on a sample plate. In this example, a mass selector was proposed to be used for the selection of a specific mass-to-charge ratio. This example, however, did not discuss or suggest the integration of the soft deposition on the sample plate with an imaging system, such as an electron holography system. Another example proposes the use of a time-of-flight detector in addition to a mass selector to perform diagnostics of selected complexes post selection. However, structural imaging, such as electron holography, was implemented in a completely separate instrument that required the samples to be packaged and hand carried to the imaging system after deposition onto a substrate. As can be determined, the above examples are limited by the lack of an integrated sample preparation and imaging system. This lack of integration is the subject of the present disclosure. Such integration is not obvious due to a number of formidable technical challenges such as difference in pressure levels, vibrational coupling, ion-optical transportation, etc. While there has been a long standing desire to solve this problem, no complete solution to date is known, and the techniques disclosed herein provide one or more solutions to disclosed problem.

In one example, the disclosed technique involves the selection (via mass spectrometry) and deposition (via soft-landing) of individual, native-like proteins or protein-protein or protein-DNA complexes onto imaging substrates, e.g., electron transparent substrates. Once deposited, the proteins may be illuminated with coherent, low energy (50 to 250 eV, for example) electrons. At these energies, it is understood that proteins and other biomolecules sustain no observable damage with even prolonged irradiation. As the electrons pass through the sample, some electrons are scattered while other electrons remain unscattered. The scattered and unscattered electrons then interfere on a detector located several centimeters from the source. The resulting inference pattern, or hologram, is then converted to a real image, e.g., profile, silhouette, back projection, of the irradiated molecule through the application of one or more computer algorithms. Because the imaging system is lens-less in some examples, optical aberrations are irrelevant and the achievable resolution is, in principle, diffraction limited. With regards to sample size, e.g., protein size, the disclosed techniques are able to view smaller samples that the above mentioned techniques cannot. For example, compared to cryo-EM, the disclosed holographic approach can image small proteins because the images do not suffer from noise or contrast problems the way cryo-EM does. Cryo-EM suffers from noise due at least in part to the electron energies involved in the imaging and contrast problems are due to the sample preparation typically required. With regards to crystallography, proteins that are hard to crystalize are difficult to determine their structure by crystallography, and such proteins are typically smaller ones or membrane/water-insoluble proteins. As such, the solution disclosed herein are capable of providing images of proteins, some of which are less than 50 kDa in size, in their native-like state.

The disclosed systems and techniques are desirably monolithic (i.e., all functions are contained in a single instrument having continuous flow), but can be divided into the following four major subsystems for purposes of discussion:

1. Sample preparation and validation
2. Ion transfer and deposition
3. Imaging
4. Reconstruction The following describes each subcomponent. It should be noted that in some embodiments, the imaging and reconstruction aspects may not be monolithic with the sample preparation through deposition aspects, which may be determined by the use of various imaging techniques.

FIG. 1 is an example monolithic sample preparation and analysis system 100 in accordance with an embodiment of the present disclosure. The system 100 prepares, transports and analyzes samples using one or more techniques. In some embodiments, the sample is a protein or biomolecule desired to be analyzed in a native-like state. In such an embodiment, the system 100 ionizes the sample, filters the desired sample from an ionized sample supply, transports the ionized sample to the analysis area where the sample is deposited on a substrate configured for the desired analysis technique. As used herein, "sample supply" refers to a sample mixture that includes a desired sample along with other materials used to form the sample mixture. In some embodiments, the ionized sample may undergo a validation technique to ensure the desired sample and/or desired state of the sample is provided for analysis. The deposition may be performed to reduce or eliminate any damage to the ionized sample. In general, the system 100 may be intended to use in the study of biological materials where sample preparation and validation are time consuming and difficult processes.

The system 100 may at least include a sample preparation, selection and validation subsystem 102, a sample transport and deposition subsystem 106, an analysis subsystem 104, and a controller 107. While not shown, various vacuum pumps and power supplies may be coupled to at least some of the subsystems and components. In some embodiments, the three subsystems 102, 104 and 106 may form a monolithic sample preparation and analysis system for imaging a sample ion that includes a continuous path from sample introduction to imaging/analysis. In other embodiments, however, the subsystems 102 and 106 may form a monolithic system for preparation and delivery of a sample ion to a substrate, which may then be delivered to an analytical tool of choice by any desirable means. In either embodiment, however, the sample preparation and deposition subsystems may determine the quality/validity of any ultimate analytical outcome. Describing system 100 as comprised of subsystems is for discussion purposes only and is not intended to be limiting. It should also be understood that the system 100 is a monolithic component in some or most embodiments and is intended to function as a single sample preparation and analytical tool.

Subsystem 102 performs various functions on an input sample supply to provide validated and filtered samples. In some embodiments, the sample is a protein, such as lysozyme, calmodulin, protein A/G, OmpF porin (an outer membrane protein of *Escherichia coli* (1)), monoclonal antibody immunoglobulin (IgG), C-reactive protein (CRP), streptavidin, and human serum albumin, to name a few. Other important objects of analysis include non-covalent complexes of proteins, DNAs, RNAs or their combinations (such as ribosome in native state) as well as more complex arrangements such as lipid rafts, micelles, regions of cell membrane, etc. Of course, the prior list of sample types is included for examples and is not limiting to the disclosure. The various functions provided by subsystem 102 at least include ionization of the input sample supply, filtering or selection of a target sample type from the sample supply, and validation that the target sample type was selected from the sample supply. An example subsystem 102 may be a Thermo Scientific™ Q Exactive™ or Orbitrap Exploris™ Mass Spectrometer. Once validation has been obtained, the filtered, ionized sample may be collisionally cooled to reduce overall kinetic energy of the sample, then the cooled sample is provided to subsystem 106. In embodiments where the sample is a protein, it may be desirable that the protein be in a desired native-like state after preparation and filtering, which may be validated by subsystem 102. Native-like state of protein or protein complex could include preservation of solvation layer around it to stabilize the conformation in the gas phase. In some embodiments, deposited proteins or protein complexes could differ from the validated one by additional optional steps of desolvation or energy deposition. Of course, in other embodiments, the protein need not be in a desired native-like state and nor does the sample need to be a protein. The discussion of the sample being formed of proteins is only for system illustration purposes and is not intended to be limiting in any way.

Subsystem 104 may comprise any type of analytical tool desired by a user. For example, subsystem 104 may be a charged particle microscope (scanning electron, transmission electron, scanning transmission electron, focused ion beam, and the like), an imaging system (such as a holographic imaging system), or some type of force-based microscope (atomic force microscope, for example). In some embodiments, subsystem 104 is a cryogenic enabled electron microscope (cryo-EM) for acquiring transmission electron microscope (TEM) images of the selected protein in its native-like state. In such an embodiment, the protein may optionally undergo vitrification prior to TEM imaging. While vitrification is commercially used, the preparation and delivery of known proteins in their native-like state provides assurance that the sample being imaged is of a desired type. If solvation layer and hence initial in-solution state of the protein is preserved, no additional vitrification may be needed. In other embodiments, subsystem 104 is a direct electron imaging system that provides electron interference images of the selected protein. In such an embodiment, the electron interference images, e.g., holograms, may be used to form images and/or reconstructions of the ionized protein. In some embodiments, analysis subsystem 104 may be a dual beam system that includes a focused ion beam and an electron beam that can be used sequentially and iteratively to remove material and image the newly exposed surfaces, such as done in slice-and-view analytical techniques that result in volume reconstructions. Also possible is tomography on the samples by imaging the samples at different angles then reconstructing the sample from the angle-specific data. Other possible analytical tools for Subsystem 104 include field electron microscopes and field ion microscopes. In general, subsystem 104 is not limited by the other subsystems, and subsystems 102 and 106 can be used to select and deposit samples for any end analysis technique. While this disclosure may use holography in most examples, such focus on holography is not intended as limiting.

Subsystem 106 provides sample transportation and deposition processes for filtered, (optionally) validated samples provided by subsystem 102. The subsystem 106 may include a plurality ion transport stages coupled together that terminates at a deposition location. The termination of the transport stages may include ion optics configured to slow the velocity of the sample ions down so that they can be deposited on a substrate without damage, or at least with minimal damage. For example, in some embodiments, it may be desirable to deposit a protein at an energy that reduces or prevents the proteins from being denatured so that they remain in a native-like state for subsequent analysis. Preferably, ion energy does not exceed 30 eV/charge or more preferably 10 eV/charge at deposition.

Each of the plurality of transport stages, in some embodiments, may be at a different vacuum level that is higher than a previous stage or subsystem. This increase in vacuum level, however, may be determined by an end analysis technique, and further based on the sample type and/or desire for cleanliness of the substrate/sample. The substrate, too, may be configured from material based on the subsequent analysis technique. For example, if the sample is to be directly imaged for the formation of holograms, then the substrate will be configured accordingly. If, on the other hand, the sample is to be imaged in a cryo-EM, then the substrate requirements may be less stringent than required for holography.

Alternatively or additionally, a substrate cleaning module may be included in system 10 to clean substrates, such as before or between deposition of a sample. In some embodiments, the substrate cleaning module is included in subsystem 104. In other embodiments, the substrate cleaning module is included in the part of subsystem 104 that couples to subsystem 104, see dashed line area in FIG. 1 for example. Regardless of the location, the substrate cleaning module uses heat to clean the substrate, such as direct heating, radiative heating, electron-based heating, and inductive heating, to name a few. In some embodiments, the heat may be provided using heaters thermally coupled to the substrate. In other embodiments, an optical source provides high intensity optical energy to heat the substrate, such as using infrared, visible or ultraviolet lasers. To effectively clean the substrate, the substrate needs to be raised to at least a temperature high enough to burn off the prior sample and any other contaminants, which may occur for a period of time ranging from 60 to 120 seconds, for example. The temperature may be sample type dependent, but can range from 50° C. to 500° C. With respect to laser-based heating, a 830 nm wavelength laser providing around 200 mW of output can be used to clean the substrate from most sample types and contaminants.

Additionally or alternatively, some embodiments of system 100 may not have subsystem 102 coupled to subsystem 104 via subsystem 106. In such embodiments, the sample may be transported by a user from subsystem 106 to subsystem 104, by hand for example. For example, an ionized protein sample is deposited onto a substrate that is then removed from subsystem 106 before inserted into subsystem 104. In some embodiments, the substrate of subsystem 106 is located in an analytical position within subsystem 104. In such an embodiment, the sample is deposited onto the substrate and is ready for analysis in that location in subsystem 104. In other embodiments, however, the substrate is translated from a deposition position at least partially in subsystem 106 to an analytical position in subsystem 104. See FIGS. 3 and 4 for examples.

Although not shown, subsystems 102 through 106 may need to be arranged so to limit acoustic, electromagnetic and/or vibrational noise sources. Further, the deposition and analysis subsystems may need to be isolated from the validation and transport aspects to further limit noise. For example, the various subsystems may be supported by damping structures and coupled to one another through one or more baffles, all of which limit the introduction and propagation of vibrational and environmental noise. While such noise may not be an issue for subsystems 102 and 106, subsystem 104 may be more susceptible to noise so that vibration isolation and dampening of all subsystems 102-106 is desired.

In operation, a sample supply is provided to subsystem 102. The sample supply, which may be in solid or liquid form, may include a target protein along with other carrier substances and/or impurities, for example. In some embodiments, the sample supply will have already been purified by other means but may still contain undesirable impurities. Of course, pre-purification may not be necessary, yet it may reduce processing time within subsystem 102. Subsystem 102 may initially ionize the sample supply to prepare for filtering, such as by electro-spray ionization, laser ionization, photon ionization or electrical field ionization, for a few examples. Filtering may then be performed to extract the target protein from the sample supply. For example, the target protein may be filtered using mass to charge ratio techniques, such as by a mass spectrometer. In some embodiments, the filtered, ionized proteins may then be validated to ensure the target protein is the desired protein. For example, the ionized protein may undergo simple accurate intact mass measurements or sequencing via fragmentation to determine the makeup of the ionized protein. The validation of the sample may only use some of the ionized protein to preserve the rest for analysis. Alternatively, the validation may be performed before additional sample supply is prepared. Another alternative includes validation in parallel with deposition. Once the ionized protein has been validated, the ionized protein is collisionally cooled then transported to a substrate using RF-only multipoles, for example. To ensure the ionized protein is kept in its native-like state, e.g., is not denatured, soft-landing techniques are employed to deposit the ionized protein onto the substrate. It should be noted that the substrate type, e.g., configuration and material makeup, may be different depending on the desired analytical techniques. As noted, the location of the substrate during deposition may be in different locations depending on subsystem 106 type. For example, the location of the substrate may be in an analytical location, at a deposition location or in a moveable container for delivery to subsystem 104. After deposition, the desired analysis may be performed in a respective subsystem 104.

Figure 2:
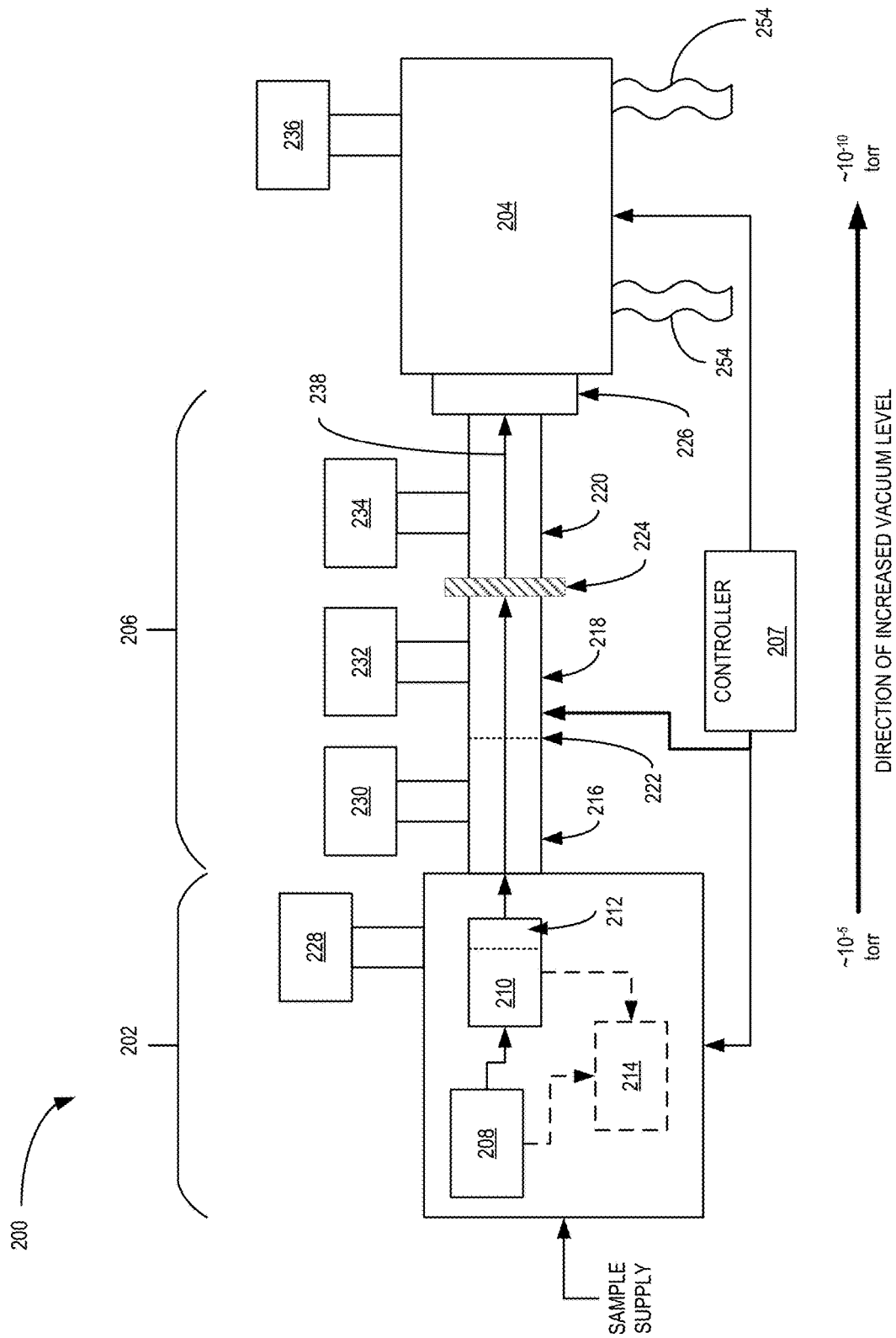
FIG. 2 is an example electron holography system in accordance with an embodiment of the present disclosure.

FIG. 2 is an example electron holography system 200 in accordance with an embodiment of the present disclosure. The system 200 is one example of the system 100 in which holograms of prepared and imaged samples are realized. System 200 is a monolithic tool that receives an input sample supply and provides either interference images of a target sample and/or holographic-based reconstructions of the target sample. In some embodiments, the target sample is a protein and the system 200 provides images and/or reconstructions of the protein in a native-like state, which is realized due to a soft landing technique employed during deposition of the protein onto an imaging substrate. Of course, other sample types are also contemplated and are within the contours of the disclosure.

The system 200 includes a sample preparation, filtering and validation subsystem 202, a transport and deposition subsystem 206 and an imaging subsystem 204, which are all coupled to and controlled by controller 207. As noted, the subsystems 202-206 operate in concert to filter/prepare a target sample from a sample supply and provide images and/or reconstructions of the target sample. For example, a sample supply, which may be a solid or liquid, is provided to subsystem 202 that at least ionizes and filters the target sample from the sample supply. The target sample is then provided to subsystem 206 for transport and deposition onto a substrate. Once deposited, subsystem 204 acquires interference images or diffraction patterns of the target sample, which are then used to reconstruct images of the target protein. The reconstructed images may be generated by the controller 207, or the interference images may be provided to a cloud-based computing system via the controller 207 for reconstruction.

Subsystem 202 at least includes ionization module 208, filter 210, collisional cooling module 212, and optional validation module 214. Additionally, subsystem 202 is coupled to pump 228 to provide a low pressure environment to at least collisional cooling module 212. Pump 228 may be either a single or multiple port vacuum pump as known in the art. While collisional cooling module 212 may be at low pressure, such as $10^{-5}$ torr for example, other components of subsystem 202 may be at higher pressures and/or at atmospheric pressure. For example, ionization module 208 is at atmospheric pressure and as the sample supply propagates through subsystem 202, the local pressure experienced may decrease with each processing component. In general, subsystem 202 ionizes and filters/selects desired samples from a provided sample supply. In some embodiments, validation module 214 is included to verify that the target sample was successfully selected from the sample supply. In other embodiments, validation may occur via analysis module 204 after an initial sample is analyzed. Regardless of embodiment, subsystem 202 provides a selected/filtered, ionized sample at a reduced kinetic energy to transport subsystem 206. In some embodiments, subsystem 202 may be a Q Exactive™ or Orbitrap Exploris™ (series) Mass Spectrometer. Of course, discrete components or other mass spectrometers may be used as well and are contemplated herein.

Ionization module 208 receives the sample supply and provides an ionized sample supply to filter 210. Ionization module 208 may embody be any type of ionization technique known and is not limited to any specific technique. Additionally, the ionization technique employed may depend on the state of the sample supply, e.g., whether it is in liquid, solid, or gaseous form. Example ionization techniques to be implemented by ionization module 208 include nano- or micro-electrospray ionization, desorption electrospray, electron or ion beam ionization, matrix-assisted laser desorption ionization, atmospheric pressure chemical ionization, atmospheric pressure photoionization, inlet ionization, laser ablation/electrospray, laser induced liquid bead ion desorption, and the like. The ionization of the sample supply may be a continuous or pulsed process at atmospheric pressure or in intermediate or high vacuum. The ionization process could be applied locally or to the entire sample supply so that all substances in the supply are subject to the ionization conditions, even if they are not capable of being ionized.

The filter 210 receives the ionizes sample supply from the ionization module 208 and filters out, e.g., selects, a target sample type from the sample supply. The filtered sample type may then be provided to either the validation module 214 (optionally) and/or collisional cooling module 212. In some embodiments, the filtered sample may be provided to the collisional cooling module 212 prior to being provided to the validation module 214. The filter 210 may be any ion filter known in the art. In some embodiments, the filter 210 may implement mass to charge ratio filtering. For example, filter 210 may be a quadrupole-based ion filter operated in a combined DC and RF mode. In such an embodiment, the filter 210 may include a plurality of quadrupole mass filters. In other embodiments, time of flight filtering or ion mobility separation techniques may be implemented.

Collisional cooling module 212 may receive the filtered, ionized sample type and acts to reduce the kinetic energy of the filtered sample. Reduction of the kinetic energy may be included so that the sample is easier to control in subsequent subsystems and to reduce the chance of damage to the sample. The collisional cooling module 212 may be a higher-collision energy dissociation (HCD) cell as known in the art, which may include continuous or pulsed gas supply to assist with the collisional cooling/thermalization of the filtered ion samples. The collisional cooling module 212 may provide the sample to either the validation module 214 or to subsystem 206 depending on a process being executed. For example, if a new sample type is desired for analysis, then the sample may be validated before being provided to subsequent subsystems. On the other hand, if validation has previously occurred, then the sample is provided to subsystem 206. In some embodiments, the sample supplied to validation module 214 may have a different state (e.g., desolvation, charge state, fragmentation, etc.) than the sample provided to subsystem 206.

The validation module 214 may receive some or all of the filtered sample from the collisional cooling module 212 (or directly from the ionization module 208) and validate that the correct sample type was filtered. For example, if the sample is a protein, the validation module 214 ensures that a desired proteoform, complexoform, or oligomeric state of the protein was prepared and selected by the filter 210. In some embodiments, the validation module 214 analyzes the sample through partial sequencing or accurate mass determination using an Orbitrap™ analyzer.

Subsystem 206 includes a plurality of differentially-pumped stages 216, 218 and 220 that transport samples from subsystem 202 to a substrate located at location 226. While three differentially-pumped stages are shown, any number of stages may be implemented. Between each differentially-pumped stage is a differential pumping aperture (DPA), such as DPA 222 and DPA 224. In some embodiments, DPA 224 may additionally be a gate valve that can be enabled to couple/decouple two adjacent differentially-pumped stages, such as stages 218 and 220. While the location of the gate valve is shown to coincide with the junction of stage 218 and 220, in other embodiments the gate valve may be located at the junction of stages 216 and 218. Decoupling the system using the gate valve allows for vibrational and vacuum isolation of subsystem 204 from the rest of system 200, which may be useful during image acquisition and/or maintenance of various areas of system 200. Each of the differentially-pumped stages 216, 218 and 220 may be coupled to a respective vacuum pump 230, 232 and 234. Some of the pumps could operate continuously while others (e.g. 234) could be switched off during imaging. In general, the vacuum level of each stage 216-220 increases as they get closer to subsystem 204 to satisfy vacuum level requirements of subsystem 204. For example, if subsystem 204 needs to be at least $10^{-9}$ to $10^{-10}$ torr and at least a portion of subsystem 202 is around $10^{-5}$ torr, then the stages 216-220 will each increase the vacuum level to maintain subsystem 204 at the desired pressure.

Each of the differentially-pumped stages 216-220 may include ion optics for transporting the filtered sample from subsystem 202 to 204. For example, each stage 216-220 may include at least one RF-driven quadrupole guide to shape the sample beam 238 and guide the sample beam 238 along subsystem 206. In some embodiments, the differentially-pumped stages 216-220 may also include electrostatic lenses and apertures, where the apertures are located at interfaces between the stages. The addition of the apertures help guide the ion beam as it traverses the stages and the electrostatic lenses help further define and/or focus the beam. While not shown in FIG. 2, each of the differentially-pumped stages 216-220 may also include vibrational mounts or isolators, such as vibrational supports 254 to reduce environmental vibration and noise creeping into system 200. The vibrational supports 254 may be gas-assisted supports, hydraulic-based, spring-based, or any vibrational support known. In some embodiments, subsystem 204 is supported by one or more vibration-dampening supports 254, as well as subsystem 206.

Subsystem 206 ends at deposition location 226, where a substrate is located or stored for depositing samples selected by subsystem 202. The final differentially-pumped stage 220 may terminate at the deposition location 226 and include a retarding lens. The retarding lens or decelerating lens, which will be discussed in more detail below, may reduce the kinetic energy of the sample prior to deposition so that the sample is deposited using soft landing techniques. The soft landing technique(s) are implemented to prevent or reduce damage to samples that may occur during the deposition process. For example, the retarding lens may be biased such to reduce the velocity of the sample prior to landing on the substrate. In some embodiments, the retarding lens may include multiple lens elements, two or three for example, with at least one element at a high negative potential and the other at ground. The substrate is at a ground potential, but in other embodiments, the substrate may be varied from a low potential to ground in order to optimize focusing of the sample onto the substrate. The biasing of the substrate for soft landing, however, may depend on the biasing regime of the retarding lens.

In some embodiments, deposition location 226 coincides with an analytical location as dictated by subsystem 204. In other embodiments, however, deposition location 226 includes the substrate arranged at a location for receiving the sample from subsystem 206. The substrate is then translated from the deposition location to an analytic location with a substrate movement component. See FIGS. 3 and 4 for examples. The substrate, as noted, may be configured depending on the subsequent analytical technique implemented. For system 200 implementing low-energy direct electron imaging for holography, it is desirable that the substrate be electron-transparent, especially at electron energies around 200 eV, planar, flat, conductive, and non-reactive to the sample materials. For other analytical techniques, however, the requirements for the substrate may be less onerous.

Subsystem 204 may be a direct electron imaging system configured to obtain interference images of a sample. The direct electron imaging may result in interference images of the sample due to scattered and unscattered electrons, for example, which form interference patterns on a detector. The subsystem 206 may include an emitter and a detector with the sample arranged therebetween. The emitter may be a low energy, coherent electron source and the detector may either be a direct electron detector or a microchannel plate-type detector as known in the art. While electrons may be the source of imaging in some embodiments, in other embodiments, other species of charged particles may be used, such as protons. It should be noted that the imaging system implemented by subsystem 204 is lens-less, which may result in no aberration and may only be diffraction limited. The resolution of such a system may be dependent on the electron wavelength and the numerical aperture (NA) of the system, where the NA depends on the coherent emission angle of the source. For such an arrangement, the larger the emission angle, the higher the NA resulting in better resolution. The magnification of subsystem 204 may be determined by the ratio of the distance between the sample and the detector and the distance between the sample and the source, which can be changed by moving the sample, the source, the detector or combinations thereof. Of course, the imaging system does not have to be lens-less and other configurations that include one or more lenses are contemplated by the disclosure. Calibration of the system may be performed by moving the sample a known amount and measuring image shift and/or by including fiducials of a known size on the substrate that are captured during image acquisition.

In some embodiments, subsystem 204 may include a substrate cleaning module to clean the substrate prior to deposition of a sample. Such cleaning module may use heat delivered to the substrate to clean the substrate. As noted above, the heat may be provided inductively, radiatively, optically or directly. In the optical heating technique, a laser may be used to provide intense optical energy to raise the temperature of the substrate enough to burn off any contaminants and prior samples deposited onto the substrate. The optical energy can be in the infrared, ultraviolet or visible wavelengths.

The controller 207 may include one or more processing cores and memory including code for operating the system 200. In some embodiments, the controller 207 may perform sample reconstruction algorithms using images acquired by subsystem 204. In other embodiments, however, the reconstruction may be performed by one or more remote servers coupled to receive images from the controller 207.

In operation, a protein-including sample supply may be initially prepared for supplying to subsystem 202. For protein samples, the preparation may include such steps as dissolving powder followed by a buffer exchange, protein expression followed by concentration/purification protocols, size-exclusion chromatography, capillary electrophoresis, solid-phase extraction, liquid chromatography, affinity separations, or other liquid-phase separations. In general, it is desirable that the initial preparation process provide the sample supply in solution and that the sample supply not have undergone agglomeration and/or denaturization so that the proteins are in a native-like state. In other embodiments, the sample supply could be also directly prepared from intact cells or cell membranes, where membrane proteins and complexes could be stabilized by membranes, nanodiscs, nanorafts, nanocontainers and other methods known in the art. The prepared sample supply may then be provided to subsystem 202 where ionization by ionization module 208 occurs. The ionization step may typically include repetitive drying and Coulomb explosion of sample droplets until all charge reside on desolvated sample ions. The ionized sample supply is then provided to filter 210 for selection of protein from the sample supply. Once the target ionized proteins are filtered, they undergo collisional cooling/thermalization by module 212. Validation by module 214 via partial sequencing or accurate mass measurement by an Orbitrap™ analyzer may then occur to ensure the desired protein proteoform has been selected by filter 210, but is optional. Upon validation, additional proteins from the sample supply may be ionized and filtered, and then collisionally cooled and provided to subsystem 206.

At this juncture, the ionized, filtered sample proteins are provided to subsystem 206 for transport to deposition location 226. The sample proteins may form an ion beam 238 that is guided by each of the plurality of stages 216-220 via intervening DPAs 222 and 224 to deposition location 226. At deposition location 226, a retarding lens of stage 220 may reduce the energy of the sample ion beam to ensure their native-like state is preserved during soft landing onto the substrate. At this point, depending on embodiment, the sample is ready for imaging due to the substrate being located at the analytical position, or the substrate is ready for translation from deposition location 226 to the analytical location for imaging. At the analytical location, an emitter directs an electron beam toward the sample, which is then detected by a detector. The detector acquires images that are then provided to controller 207 for image reconstruction. The image reconstruction may be an iterative process, a non-iterative process, and/or a neural network-based approach.

FIG. 3 is an example illustration of a sample deposition and translation arrangement 301 in accordance with an embodiment of the present disclosure. The arrangement 301 illustrates deposition of a sample at a deposition location, such as location 326, and translation of the sample to an analysis location, such as analysis location 350. The analysis location 350 associated with an analysis tool or subsystem such as subsystem 104 and/or 204. In some embodiments, for example, it may not be practical to co-locate the deposition location and the analysis location for various reasons, such as limited space or undesirable geometries. In other embodiments, however, the deposition and analysis locations may be co-located—see FIG. 4 for an example. While subsystem 304 is demarcated separate from deposition location 326, in other embodiments, subsystem 304 and deposition location 326 are combined into a single subsystem.

Arrangement 301 includes a final transport stage 320 of a transport subsystem, deposition location 326, and analysis subsystem 304. The final transport stage 320, which is an example of stage 220 of subsystems 106 and/or 206, includes a quadrupole sample guide 320A and a retarding lens 320B all surrounded by a shielding shroud. The quadrupole 320A, which may be RF-only quadrupoles in some embodiments, forms ion optics for transporting the sample from previous stages and subsystems to a deposition substrate, such as substrate 340. The retarding lens 320B may reduce the energy of the sample prior to deposition on the substrate 340 to limit or prevent unwanted sample damage. The reduction in energy is realized by biasing the retarding lens to slow down the movement of the sample ions, especially with respect to the substrate 340. Additionally, the retarding lens 320B may focus the sample ions to a small spot, e.g., an 80 µm diameter spot, to ensure a desired sample density is obtained on the substrate 340. In some instances, the diameter of the spot may be less than 80 µm, and in other instances the diameter of the spot size may be more than 80 µm. The desired sample density may require some balance of focus to ensure the sample ions are close enough together to make locating the sample deposition spot acceptable, yet the density should be sparse enough so that individual sample ions are imageable on their own, e.g., limit crowding and clumping. Controlling the bias provided to the retarding lens 320B and/or substrate 340 is part of the soft-landing strategy implemented by the systems disclosed herein. It should be noted that the biases provided to the retarding lens 320B and the substrate 340 can be static or dynamic and they operate in concert to control the movement of the sample ions as they are deposited onto the substrate 340.

In some embodiments, retarding lens 320B may be formed from two or more lens elements with each lens element potentially biased separately. For example, in an embodiment where retarding lens 320B is formed from two lens elements, a first lens element is biased at a high negative potential, around −350 eV, and a second lens element is at ground, where the second lens element is closer to the substrate—see FIG. 4 for an example configuration of the retarding lens 320B. Such a lens and biasing arrangement may focus the sample ion beam to a desired size on the deposition substrate. In some embodiments, the sample ion beam is focused to a diameter of about 80 µm. While 80 µm is given as an example, the sample spot size on the substrate can be any diameter to obtain a desired sample density that allows for imaging of complete samples but is not so sparse as to make locating the samples difficult. It should be noted that 50% of the sample will be deposited within the focus diameter, in most embodiments. Of course, other biasing regimes may be implemented to focus the ion beam differently and/or to implement various soft-landing strategies.

The deposition location 326 includes substrate 340, current monitor 354, and a portion of translation track 342. In some embodiments, substrate 340 is mounted to holder 341 that is moveably coupled to translation track 342. One or more drive mechanisms (not shown), such as piezoelectric motors, servo motors, or stepper motors, are used to move the substrate 340 and holder 341 between deposition location 326 and analysis location 350 as indicated by the arrow, e.g., in the x-direction. Additionally, holder 341 may be able to rotate on an axis, such as the R axis, due to at least one motor coupled thereto. The translation and rotation capabilities allow the substrate 340 to be moved back and forth between the deposition and analysis locations 326, 350, respectively, and further allows rotations of various degrees. Substrate rotation at the analysis location may allow for images of a sample to be acquired at different angles, which may enable tomographic analysis of samples, for example. Further, holder 341 may include motors and drives to move the substrate 340 around on the holder 341 so that the position of the substrate can be changed. The movement of the substrate 340 may be rotational and/or translational. Movement of the substrate on the holder 341 may allow for depositing the sample at a known location on substrate 340.

Additionally, holder 341 may include one or more heaters in some embodiments. The one or more heaters (not shown) allow the holder 341 to raise the temperature of substrate 340. Increasing the temperature of the substrate 340 may allow for in situ cleaning, such as to remove contamination and/or remove deposited samples when desired. In other embodiments, the holder 341 does not include heaters, but the substrate 340 may be heated with high intensity optical power from an optical source (see FIG. 4 for an example optical source configuration for arrangement 301), such as a laser, located inside or outside of subsystem 304 or arranged in or adjacent to deposition location 326. The laser may provide infrared, visible or ultraviolet energy. Holder 341 may be patterned with apertures to allow for charged particles, electrons for example, to pass through for analysis purposes and/or may engage the substrate 340 around the edges.

Current monitor 354 detects where the sample ions are deposited onto the substrate 340 by measuring changes and/or locations where the ion sample deposition produces current. In some embodiments, holder 341 may include an aperture plate that can be placed between retarding lens 320B and substrate 340. The aperture of the aperture plate (not shown) will have a known location relative to the substrate 340 position or positions and current monitor 354 will measure electrical current impinging the aperture plate outside of the aperture. In some embodiments, current monitor 354 could be integrated with the aperture plate or substrate 340. By scanning the aperture across the sample beam 338 as it is being deposited onto substrate 340, current monitor 354 will measure current as the aperture permits the sample beam 338 to pass to the substrate 340. For example, as the sample beam 338 passes through the aperture, current on the current monitor 354 is maximized while, simultaneously, current on the aperture plate, e.g., holder 341, is minimized, thereby determining the location of the beam relative to the substrate position due to the known location of the aperture. Further, once the location of the sample beam 338 is determined, the substrate 340 may be moved to intercept the sample beam 338. Other techniques of locating the beam may include electrostatically scanning the beam over a Faraday cup, or scanning a Faraday cup or electrometer through the beam. Alternatively, one could choose not to locate the beam and instead simply scan the beam over a sufficiently large scan field and with a sufficient scan time that, given the known extent of the substrate or substrates and the properties of the beam, one could be statistically certain of landing proteins on the substrate with an appropriate spatial density. Further, instead of determining where the sample is located on the substrate at the deposition location 326, the substrate may be moved to the analysis location 350 then scanned with the analytical tool to determine the location of the sample.

The substrate 340 may be formed from a number of materials that meet desired qualities. In general, the substrate should be electron transparent, ultra-clean, non-reactive and conductive. In some embodiments, the material used for the substrate 340 is a two-dimensional (2D) material. Example (2D) materials for substrate 340 include single- or double-layer graphene, hexagonal boron nitride (hBN), molybdenum disulfide, tungsten diselenide, and hafnium disulfide. In terms of the graphene example, it is desirable to suspend the graphene over pores formed in a thin silicon nitride membrane, for example, where the pores have diameters on the order of hundreds of nanometers to microns. Regardless of the material used, it must be electron transparent at energies less than 200 eV. In general, the substrate 340 should be electron transparent to such a degree as to allow the formation of a hologram with acceptable signal-to-noise ratio at kinetic energies of the imaging beam that do not damage or destroy the sample. In some embodiments, there will be multiple target substrates included in order to increase instrument throughput.

The subsystem 304, in this embodiment, includes emitter 344, detector 346, and the rest of translation track 342. The emitter 344 is a coherent, low energy electron source in most embodiments, but other charged particle types may be used in other embodiments, such as protons. In some embodiments, emitter 344 may be operated at 300 eV or less to prevent damage to protein samples, but other operating voltages are possible depending on the sample type. In some embodiments, emitter 344 is operated at 250 eV, and may be operated to provide an electron beam at a current in the range from nA to pA. The emitter 344 may be formed from a variety of materials to provide the coherent, low energy electron beam. Example materials include sharp tungsten, sharp nano protraction emitters, single atom emitters, lanthanum hexaboride (LaB6) nanorod, carbon-based sources (nanotube, electro-spun, graphene and the like), large-molecule based emitters, and nitrogen-etched tungsten sources. Additionally, emitter 344 may be a cold field-emission electron source, a Schottky electron source, photocathode-based source, thermionic source, or a plasma source, to name a few examples. In general, as noted, it is desirable that the emitter 344 provide a coherent electron. For example, if the subsystem 304 is a holographic system, then the coherence of the electron beam provided by emitter 344 will affect the quality of the resulting holograms.

Detector 346 detects electrons after passing through and/or around the sample. The detector 346 can be any detector used for electron detection and that can resolve spatial distribution of the detected electrons. For example, detector 346 may be a microchannel plate type detector or a direct electron detector. In either embodiment, the detector 346 acquires interference images or diffraction patterns formed by the electron beam 352 being diffracted by the sample when in the sample location 350. The interference images or diffraction patterns, as noted, are the holograms of the sample.

In operation, sample ions (in the form of a sample ion beam 338) are guided by transport stage 320A (which were previously ionized and filtered from a sample supply) to retarding lens 320B. Retarding lens 320B is at a bias voltage that slows down the sample ion beam 338 prior to the sample ions landing on the substrate 340. Additionally, an electrode shape of, the bias applied to, and/or an arrangement of a plurality of lens elements of the retarding lens 320B may focus the sample ion beam 338 into a desired size, 80 μm diameter spot for example. In some embodiments, a bias may also be applied to substrate 340 to enhance the soft-landing of the sample ions on substrate 340. During deposition, one of the above detection techniques, e.g., current measurement while moving an aperture, is applied to determine the deposition location of the sample. It should be noted that the sample ions are typically neutralized, e.g., de-ionized, upon deposition onto substrate 340. Once the sample is deposited, whether its location is determined during deposition or will be determined by subsystem 304, the holder 341 is moved from deposition location 326 to analysis location 350.

Once in the analysis location 350, emitter 344 emits a beam of charged particles 352, such as electrons, toward the sample and detector 346 detects images formed thereon due to the interaction of the charged particles of the charged particle beam 352 and the sample. The sample stage may be moved (slightly) to provide differing illumination and information on the molecule of interest. The detected images, which may be interference patterns for example, may then be provided to a controller, such as controller 107 and/or 207, or to one or more networked computing cores for image reconstruction. The image reconstruction, which may be a profile, silhouette or back projection of the electron interference pattern for example, are based on the acquired images. Stated another way, the image reconstruction is a reconstruction of the electron exit wave as it exits the sample.

FIG. 4 is an illustrative deposition arrangement 401 in accordance with an embodiment of the present disclosure. The arrangement 401 is similar to arrangement 301 except for the lack of translation required from the deposition location to the analysis location. Instead, as illustrated, sample ions are deposited on the substrate while the substrate is in the analysis location. Arrangement 401 includes a final transport stage 420, a substrate 440 mounted on holder 441, emitter 444 and detector 446. Some of the listed components are similar to those discussed with regards to FIG. 3, and will not be re-discussed for the sake of brevity. Arrangement 401 illustrates an embodiment of a system, such as system 100 and/or 200, where the deposition of the sample occurs while the substrate is located in the analysis location. For example, sample ion beam 438 propagates down stage 420A to retarding lens 420B where the sample ions are soft-landed onto substrate 440. Once deposited, electron beam 452 is directed toward the sample and detector 446 acquires images of the interaction of the electrons and the sample ions.

Final transport stage 420 includes differentially-pumped stage 420A coupled to a final lens assembly 420B, e.g. retarding lens 420B. Stage 420A is formed from an RF-only quadrupole 423 coupled to provide the ion beam 430 to final lens assembly 420B. Final lens assembly 420B is formed from at least two lens elements biased to focus the ion beam to a spot of a desired diameter. In some examples, the spot size is 80 μm in diameter. In some embodiments, a first lens element 421B is at a negative potential, e.g., ~350 eV, while a second lens element 421A, which is disposed closer to the substrate than the first lens element, is at a ground potential.

While arrangement 401 does not include a translation track, holder 441 may still include motors (not shown) for moving the substrate around on the holder and/or for rotating the substrate around an axis. Additionally, holder 441 may also include heaters as discussed above, or could be the target of heating via an optical source of energy, such as laser 453 emitting optical power 455 toward the substrate 440. Laser 453 may be included inside of a subsystem that includes arrangement 401, such as subsystem 104 and/or 204, but it may alternatively be located outside of the subsystem with the optical power 455 coupled into the subsystem through an optical port, for example. To reduce constraints on alignment of sample ion beam 448 with an optimized analysis location, the holder 441 may move the substrate 440 around while electrons 452 are emitted to determine the deposition location of the sample ions.

In some embodiments, stage 420 may be at a sharp angle of incidence with respect to substrate 440. For example, the angle of incidence may be at 45° with respect to the substrate. The sharp angle of incidence may be necessitated due to at least the physical arrangement and sizes of the emitter 444 and substrate 440. In some embodiments, the distance between the end of retarding lens 420B and the substrate 440 may also be a factor regarding the arrangement since this distance may affect the soft-landing parameters and the spot size of the deposited sample.

FIG. 5 is an example method 501 for preparing and analyzing samples in accordance with an embodiment of the present disclosure. The method 501 may be performed on systems such as systems 100 and/or 200. The method 501 includes steps and processes taken for preparing a sample and delivering the prepared sample to an analysis tool/subsystem. In one embodiment, the sample is a protein that is imaged in a native-like state where the images, e.g., interference patterns, are reconstructed into a real image of the protein. In another embodiment, the sample is similarly prepared but is analyzed in a cryogenic electron microscope. Other analysis techniques may include atomic force microscopy (AFM), tomography, single particle analysis, and the like. In general, the preparation and deposition facets of the disclosed systems and techniques can be used to provide samples, such as proteins, in a desired state for analysis by any desired technique and are not limited to the analysis techniques listed herein.

The method 501 may begin at process block 503, which includes sample supply preparation. Sample supply preparation in this context may include sample purification, which may include combining desired sample material with an appropriate buffer(s) or employing liquid chromatography techniques. Either way, it is desirable that the sample supply is in a solution and should not have undergone agglomeration and/or denaturization. As used herein, sample supply is a mixture that includes a desired sample type along with other substances, some of which may be impurities and others may form the liquid solution the sample type is within.

Process block 503 may be followed by process block 505, which includes ionization of the sample supply. In some embodiments, the sample supply undergoes electrospray ionization into a mass spectrometry system used as subsystem 202, for example. Other Examples of ionization include impact ionization via inlet ionization, an electron, ion or photon beam, and the like. In other Examples, a specific location of a tissue is addressed by desorption electrospray, laser, or any local extraction tool to extract ions of interest.

Process block 505 may be followed by process block 507, which includes filtering the sample supply to select a desired sample ion. The above mentioned mass spectrometer provides an example means of selecting/filtering out the desired sample type from the sample supply via mass/charge separation, for example, using one or more quadrupole mass filters. In other embodiments, time-of-flight mass spectrometry may be used as the selecting technique.

Process block 507 may be followed by process block 509, which includes collisional cooling or thermalization of the filtered sample ions. By reducing the sample ions to a lower kinetic energy, they can be delivered to either the analytical components of the mass spectrometer, e.g., a validation module, or to the transport and deposition subsystem, such as subsystem 106 and/or 206 while reducing the risk of or eliminating the risk of damaging the sample ions.

Process block 509 may be followed by process block 511, which includes validating the filtered sample ions. In some embodiments, this includes partial sequencing or accurate mass measurement using an Orbitrap™ analyzer, for example. However, other types or validating tests may also be used in process block 511. It should be noted that process block 511 is optional and/or may be used at the start of an experiment to verify sample identity, then omitted during additional experimental runs.

Process block 511 may be followed by process block 513, which includes transport of the filtered sample ions. The transport may be provided by a plurality of differentially-pumped stages, such as stages 216-220, each coupled to a respective vacuum pump. In some embodiments, each stage contains at least one RF-only ion guide. In other embodiments, a single ion guide could also span two or more differentially pumped stages. Of course, various permutations of stage arrangement may also be implemented. By differentially-pumping the stages, an analytical tool with higher vacuum requirements may be directly coupled to a transport subsystem, such as subsystems 106/206. In some embodiments, a gate valve may be included in the transport subsystem so that the sample preparation components may be decoupled from the analysis subsystem.

Process block 513 may be followed by process block 515, which includes deposition of the filtered sample ions. The filtered sample ions may be deposited on an imaging substrate configured based on subsequent analytical techniques. For example, the imaging substrate for holography should be conductive, non-reactive (to the sample type), planar, thin and ultraclean. In some embodiments, the imaging substrate is a single or double layer graphene screen. Of course, other substrate types are useable. Additionally, the deposition may include soft-landing the filtered sample ions onto the imaging substrate to prevent or limit undesired damage. In some embodiments, the deposition may be performed at a deposition location, then the substrate is moved to an analysis location for imaging. In other embodiments, however, the deposition location and the analysis location are the same and no translation of the substrate is needed.

Process block 515 may be followed by process block 517, which includes imaging the filtered samples. In some embodiments, the imaging includes directing a charged particle beam, e.g., electron beam, toward the filtered sample ions on the substrate and detecting the interaction of the electrons with the sample. For example, interference patterns generated due to the electron/sample interaction may be acquired. The electron/sample interaction may cause some electrons to scatter and others that are not scattered to form an interference pattern on the detector surface. In other examples, secondary or backscattered electrons may be detected from the filtered sample ions such as in a cryo-EM analysis tool.

In some embodiments of method 501, while at least process block 517 is being performed, the method 501 may re-begin with at least process block 505 so that a subsequent sample supply, either the same or different than before, may be prepared for imaging, i.e., process block 517. In such an embodiment, both the method 501 and an associated apparatus, such as system 200, may continuously operate to provide near real-time images and reconstructions of a sequence of samples. In other embodiments, subsequent samples may begin the preparation process during transport, i.e., process block 513, of a previously prepared sample. These listed variations on continuously performing method 501 are not conclusive and other variations are also possible as long as the system can physically perform the process blocks while avoiding sample co-mingling.

Process block 517 may be followed by process block 519, which includes reconstruction of the sample based on acquired images. In the holography embodiment, the reconstruction provides images of the sample based on the acquired holograms. In the cryo-EM embodiment, secondary electron and/or backscatter electron images may be reconstructed into volumes based on slice-and-view or tomographic techniques.

The method 501 may additionally include process block 521, which includes substrate cleaning. The substrate cleaning may include any technique desired to clean the substrate of contaminants and/or prior deposited samples, but, in some embodiments, be performed by heaters thermally coupled to the substrate or using optical power directed at the substrate. The timing of process block 521 may occur at any time prior to deposition of the newly prepared sample, which can occur in parallel with any of process blocks 503 through 511. In most embodiments, process block should be performed before process block 513, but could also be performed in parallel with special care taken to address timing of cleaning prior to deposition in process block 515.

FIG. 6 is an example functional block diagram 600 in accordance with an embodiment of the present disclosure. FIG. 6 is a block diagram that illustrates a computer system 600 that an embodiment of the invention may include. The computing system 600 may be an example of computing hardware included with system 100 and/or 200, such controller 107/207, subsystems 102, 104, 106, 202, 204, 206, and/or coupled servers (not shown). Computer system 600 at least includes a bus 640 or other communication mechanism for communicating information, and a hardware processor 642 coupled with bus 640 for processing information. Hardware processor 642 may be, for example, a general purpose microprocessor. The computing system 600 may be used to implement the methods and techniques disclosed herein, such as methods 301 and 401, and may also be used to obtain images and segment said images with one or more classes.

Computer system 600 also includes a main memory 644, such as a random access memory (RAM) or other dynamic storage device, coupled to bus 640 for storing information and instructions to be executed by processor 642. Main memory 644 also may be used for storing temporary variables or other intermediate information during execution of instructions to be executed by processor 642. Such instructions, when stored in non-transitory storage media accessible to processor 642, render computer system 600 into a special-purpose machine that is customized to perform the operations specified in the instructions.

Computer system 600 further includes a read only memory (ROM) 646 or other static storage device coupled to bus 640 for storing static information and instructions for processor 642. A storage device 648, such as a magnetic disk or optical disk, is provided and coupled to bus 640 for storing information and instructions.

Computer system 600 may be coupled via bus 640 to a display 650 for displaying information to a computer user. An input device 652, including alphanumeric and other keys, is coupled to bus 640 for communicating information and command selections to processor 642. Another type of user input device is cursor control 654, such as a mouse, a trackball, or cursor direction keys for communicating direction information and command selections to processor 642 and for controlling cursor movement on display 650. This input device typically has two degrees of freedom in two axes, a first axis (e.g., x) and a second axis (e.g., y), that allows the device to specify positions in a plane.

Computer system 600 may implement the techniques described herein using customized hard-wired logic, one or more ASICs or FPGAs, firmware and/or program logic which in combination with the computer system causes or programs computer system 600 to be a special-purpose machine. According to one embodiment, the techniques herein are performed by computer system 600 in response to processor 642 executing one or more sequences of one or more instructions contained in main memory 644. Such instructions may be read into main memory 644 from another storage medium, such as storage device 648. Execution of the sequences of instructions contained in main memory 644 causes processor 642 to perform the process steps described herein. In alternative embodiments, hard-wired circuitry may be used in place of or in combination with software instructions.

The term "storage media" as used herein refers to any non-transitory media that store data and/or instructions that cause a machine to operate in a specific fashion. Such storage media may comprise non-volatile media and/or volatile media. Non-volatile media includes, for example, optical or magnetic disks, such as storage device 648. Volatile media includes dynamic memory, such as main memory 644. Common forms of storage media include, for example, cloud storage, a floppy disk, a flexible disk, hard disk, solid state drive, magnetic tape, or any other magnetic data storage medium, a CD-ROM, any other optical data storage medium, any physical medium with patterns of holes, a RAM, a PROM, and EPROM, a FLASH-EPROM, NVRAM, any other memory chip or cartridge, content-addressable memory (CAM), and ternary content-addressable memory (TCAM).

Storage media is distinct from but may be used in conjunction with transmission media. Transmission media participates in transferring information between storage media. For example, transmission media includes coaxial cables, copper wire and fiber optics, including the wires that comprise bus 640. Transmission media can also take the form of acoustic or light waves, such as those generated during radio-wave and infra-red data communications.

Various forms of media may be involved in carrying one or more sequences of one or more instructions to processor 642 for execution. For example, the instructions may initially be carried on a magnetic disk or solid state drive of a remote computer. The remote computer can load the instructions into its dynamic memory and send the instructions over a telephone line using a modem. A modem local to computer system 600 can receive the data on the telephone line and use an infra-red transmitter to convert the data to an infra-red signal. An infra-red detector can receive the data carried in the infra-red signal and appropriate circuitry can place the data on bus 640. Bus 640 carries the data to main memory 644, from which processor 642 retrieves and executes the instructions. The instructions received by main memory 644 may optionally be stored on storage device 648 either before or after execution by processor 642.

Computer system 600 also includes a communication interface 656 coupled to bus 640. Communication interface 656 provides a two-way data communication coupling to a network link 658 that is connected to a local network 660. For example, communication interface 656 may be an integrated services digital network (ISDN) card, cable modem, satellite modem, or a modem to provide a data communication connection to a corresponding type of telephone line. As another example, communication interface 656 may be a local area network (LAN) card to provide a data communication connection to a compatible LAN. Wireless links may also be implemented. In any such implementation, communication interface 656 sends and receives electrical, electromagnetic or optical signals that carry digital data streams representing various types of information.

Network link 658 typically provides data communication through one or more networks to other data devices. For example, network link 658 may provide a connection through local network 660 to a host computer 662 or to data equipment operated by an Internet Service Provider (ISP)

664. ISP 664 in turn provides data communication services through the world wide packet data communication network now commonly referred to as the "Internet" 666. Local network 660 and Internet 666 both use electrical, electromagnetic or optical signals that carry digital data streams. The signals through the various networks and the signals on network link 658 and through communication interface 656, which carry the digital data to and from computer system 600, are example forms of transmission media.

Computer system 600 can send messages and receive data, including program code, through the network(s), network link 658 and communication interface 656. In the Internet example, a server 668 might transmit a requested code for an application program through Internet 666, ISP 664, local network 660 and communication interface 656.

The received code may be executed by processor 642 as it is received, and/or stored in storage device 648, or other non-volatile storage for later execution.

The foregoing disclosure is intended to illustrate various embodiments of a (monolithic) sample preparation and analysis system, but is not intended to be exhaustive. Those skilled in the art will understand and recognize aspects of the disclosure that can be substituted for other components while still conforming to the contours of the present disclosure. Those identified aspects and components are still part of the disclosure and their explicit absence is not intended to prevent their inclusion.

What is claimed is:

1. An apparatus comprising:
   an ion filter coupled to select a sample ion from an ionized sample supply;
   an energy reduction cell coupled to receive the selected sample ion and reduce a kinetic energy of the sample ion;
   a substrate positioned to receive the sample, the substrate arranged on a substrate holder, wherein the substrate holder is moveably coupled to translation track to move the substrate from a deposition location to an analysis location, and wherein the substrate is in the deposition location when receiving the sample;
   an ion transport module coupled to receive the sample ion from the energy reduction cell and transport the sample ion to the substrate; and
   an imaging system arranged to image the sample located on the substrate, wherein the substrate is positioned in the analysis location by the substrate holder prior to imaging, the imaging system including:
      an emitter coupled to direct a charged particle beam toward the sample; and
      a detector arranged to detect charged particles emitted from or transmitted through the sample.

2. The system of claim 1,
   wherein the substrate holder includes motors for moving the substrate holder from the deposition location to the analysis location.

3. The system of claim 2, wherein the translation track extends from the deposition location to the analysis location.

4. The system of claim 2, wherein the substrate holder includes heaters to heat the substrate.

5. The system of claim 1, further including an optical energy source coupled to provide optical energy to the substrate.

6. The system of claim 1, wherein the ion transport module includes a plurality of differential pumping stages, and wherein the ion transport module receives the sample ion at a first vacuum level and provides the sample ion at a second vacuum level, the second vacuum level higher than the first vacuum level, wherein each differential pumping stage of the plurality of differential pumping stages respectively increases the vacuum level from the first to second vacuum level.

7. The system of claim 6, wherein a final differential pumping stage of the plurality of differential pumping stages includes a retarding lens disposed on an output, the retarding lens coupled to reduce the kinetic energy of the sample ion before providing the sample ion to the substrate.

8. The system of claim 7, wherein the retarding lens includes first and second lens elements, the first lens element biased in relation to the second lens element to focus the sample ions.

9. The system of claim 1, wherein the substrate is formed from one of graphene, hexagonal boron nitride, molybdenum diselenide, and hafnium disulfide, or other two-dimensional material.

10. The system of claim 9, wherein the graphene is a single- or double-layer graphene sheet.

11. The system of claim 1, further including an ionizer coupled to receive a sample supply, ionize the sample supply, and provide the ionized sample supply to the ion filter.

12. The system of claim 1, wherein at least the ion filter, energy reduction cell and validation unit are included in a mass spectrometer.

13. The system of claim 1, further including a gate valve to couple and decouple the imaging system from at least part of the ion transport module.

14. The system of claim 1, further comprising dampening supports, wherein at least the imaging system is mounted on the dampening supports.

15. A method comprising:
   ionizing a sample supply;
   filtering, with a filter, a target sample ion from the ionized sample supply;
   depositing the target sample ion onto a substrate, the substrate located at a deposition location;
   translation the substrate from deposition location to an analysis location after the target sample is deposited on the substrate; and
   imaging, with charged particles, the target sample on the substrate, the substrate located in the analysis location, wherein the target sample is a neutralized target sample ion.

16. The method of claim 15, wherein depositing the target sample ion onto a substrate includes transporting the target sample via a plurality of differentially-pumped stages from at least the filter to the substrate.

17. The method of claim 15, wherein depositing the target sample onto a substrate incudes soft-landing the target sample ion on the substrate with a retarding lens biased to reduce a kinetic energy of the target sample ion before landing on the substrate.

18. The method of claim 15, further including:
   collisionally cooling the target sample ion prior to depositing the target sample ion onto the substrate.

19. The method of claim 15, further including:
   validating the target sample ion with mass measurement or partial sequencing.

20. The method of claim 15, further comprising:
   while imaging the target sample, ionizing and filtering a subsequent sample supply.

21. The method of claim 20, further comprising collisionally cooling the subsequent sample supply.

22. The method of claim 20, further comprising validating the subsequent sample supply.

23. The method of claim 15, further including cleaning the substrate.

24. The method of claim 23, wherein cleaning the substrate includes one of direct heating, radiative heating, and inductive heating.

25. The method of claim 15, wherein the filter is one of a quadrupole mass filter, a time of flight filter and an ion mobility filter.

26. A direct electron imaging system, the system comprising:
 a sample preparation and validation subsystem coupled to receive a sample supply and provide a target sample ion, the sample preparation and validation subsystem includes an ionization module for ionizing the sample supply and a filter for filtering out a target sample ion from the ionized sample supply;
 a transportation and deposition subsystem coupled to receive the target sample ion and deposit the target sample ion onto a substrate, the transportation and deposition subsystem includes a plurality of differentially-pumped stages for transporting the target sample ion to a deposition location, the substrate located at the deposition location;
 an imaging subsystem coupled to image the target sample ion; and
 a controller coupled to control the sample preparation and validation, transportation and deposition and imaging subsystems, the controller coupled to memory including code that, when executed, causes the system to:
  ionize the sample supply;
  filter the target sample ion from the ionized sample supply;
  deposit the target sample ion onto the substrate, the substrate located at a deposition location and arranged on a substrate holder;
  translate the substrate, using the substrate holder, from the deposition location to an analysis location after the target sample is deposited on the substrate; and
  image, with electrons, a target sample on the substrate, the substrate located in the analysis location, wherein the target sample is a neutralized target sample ion.

* * * * *